United States Patent
Kautzsch

(10) Patent No.: US 10,604,405 B2
(45) Date of Patent: Mar. 31, 2020

(54) FORMING A MICROELECTROMECHANICAL SYSTEMS (MEMS) DEVICE USING SILICON-ON-NOTHING AND EPITAXY

(71) Applicant: Infineon Technologies Dresden GmbH, Dresden (DE)

(72) Inventor: Thoralf Kautzsch, Dresden (DE)

(73) Assignee: Infineon Technologies Dresden GmbH, Dresden (DE)

(*) Notice: Subject to any disclaimer, the term of this patent is extended or adjusted under 35 U.S.C. 154(b) by 0 days.

(21) Appl. No.: 15/481,075

(22) Filed: Apr. 6, 2017

(65) Prior Publication Data

US 2018/0290883 A1    Oct. 11, 2018

(51) Int. Cl.
*H01L 21/20*     (2006.01)
*B81C 1/00*      (2006.01)
(Continued)

(52) U.S. Cl.
CPC ........ *B81C 1/00158* (2013.01); *B81B 3/0078* (2013.01); *B81C 1/00103* (2013.01); *B81C 1/00182* (2013.01); *G01C 19/5783* (2013.01); *G01S 7/4811* (2013.01); *H04R 19/005* (2013.01); *B81B 2201/0235* (2013.01); *B81B 2201/0242* (2013.01); *B81B 2203/0127* (2013.01); *B81B 2203/0136* (2013.01); *B81C 2201/013* (2013.01); *B81C 2201/014* (2013.01); *B81C 2201/0116* (2013.01); *B81C 2201/0142* (2013.01); *B81C 2203/0728* (2013.01); *G01C 19/00* (2013.01); *G01P 15/00* (2013.01); *G01P 15/0802* (2013.01); *G01P 15/125* (2013.01);
(Continued)

(58) Field of Classification Search
CPC .. H04R 19/04; H04R 2201/003; G01C 19/00; G01P 15/00; G01S 7/4811; B81C 1/00158; B81C 2201/014; B81C 2201/013; B81C 2203/0728; B81B 3/0078; B81B 2203/0127; B81B 2201/0242; B81B 2201/0235; H01L 2924/14; H01L 2924/00; H01L 2924/13062; H01L 2924/13091; H01L 2924/1461; H01L 21/02293; H01L 21/02694; H01L 21/20; H01L 21/2022; H01L 21/36; H01L 39/2458
See application file for complete search history.

(56) References Cited

U.S. PATENT DOCUMENTS

| | | | |
|---|---|---|---|
| 6,829,814 B1 * | 12/2004 | Freeman | B81C 1/00666 29/25.41 |
| 7,015,147 B2 | 3/2006 | Lee et al. | |
| 7,545,945 B2 | 6/2009 | Miles | |
| 7,906,381 B2 | 3/2011 | Loubet et al. | |
| 2005/0020085 A1 * | 1/2005 | Lee | H01L 21/7624 438/700 |

(Continued)

FOREIGN PATENT DOCUMENTS

DE      102016217001      3/2018

*Primary Examiner* — Moin M Rahman
(74) *Attorney, Agent, or Firm* — Harrity & Harrity, LLP

(57) ABSTRACT

A method for forming a microelectromechanical systems (MEMS) device may include performing a first silicon-on-nothing process to form a first cavity in a substrate. The method may include depositing an epitaxial layer on a surface of the substrate. The method may include performing a second silicon-on-nothing process to form a second cavity in the epitaxial layer. The method may include exposing the first cavity and the second cavity by removing a portion of the substrate and the epitaxial layer.

20 Claims, 8 Drawing Sheets

(51) Int. Cl.

| | |
|---|---|
| *G01C 19/5783* | (2012.01) |
| *H04R 19/00* | (2006.01) |
| *B81B 3/00* | (2006.01) |
| *G01S 7/481* | (2006.01) |
| *G01P 15/125* | (2006.01) |
| *G01P 15/08* | (2006.01) |
| *H04R 31/00* | (2006.01) |
| *G01C 19/00* | (2013.01) |
| *G01P 15/00* | (2006.01) |
| *H04R 19/04* | (2006.01) |

(52) U.S. Cl.
 CPC ............. *H04R 19/04* (2013.01); *H04R 31/00* (2013.01); *H04R 2201/003* (2013.01)

(56) References Cited

U.S. PATENT DOCUMENTS

| | | | |
|---|---|---|---|
| 2011/0298008 A1* | 12/2011 | Greene | H01L 21/3247 257/190 |
| 2014/0047259 A1* | 2/2014 | Price | G06F 1/3206 713/324 |
| 2015/0001665 A1* | 1/2015 | Kautzsch | H01L 31/0352 257/436 |
| 2015/0021722 A1 | 1/2015 | Dehe et al. | |
| 2015/0147839 A1* | 5/2015 | Scire | H01L 51/0023 438/46 |
| 2016/0227896 A1* | 8/2016 | Chien | A45C 11/00 |
| 2016/0347608 A1* | 12/2016 | Goh | B81B 7/0038 |
| 2017/0297895 A1 | 10/2017 | Kautzsch et al. | |
| 2018/0065846 A1 | 3/2018 | Kautzsch et al. | |

\* cited by examiner

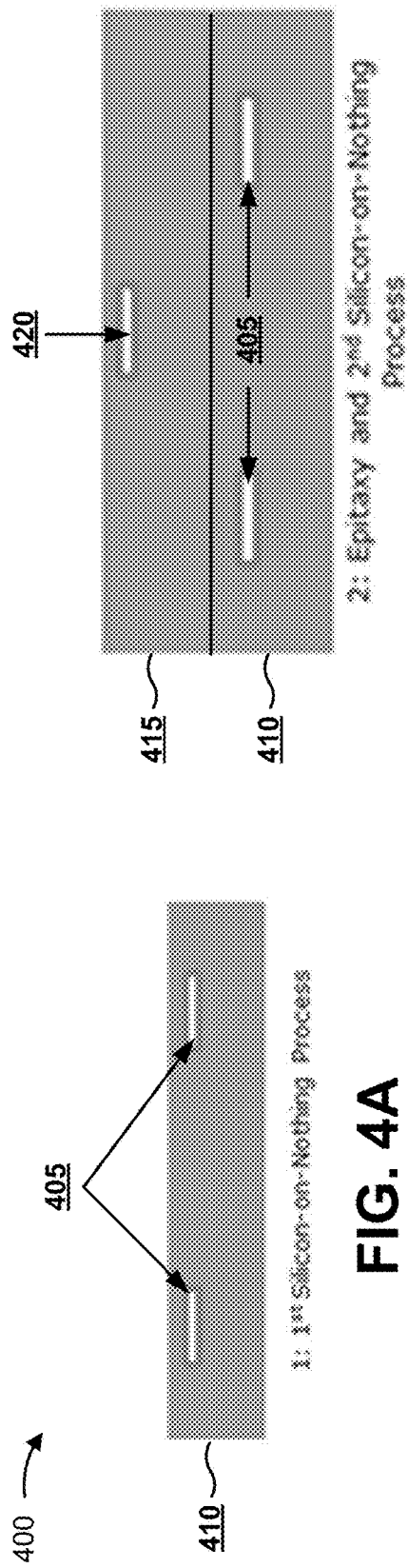
FIG. 4A
FIG. 4B
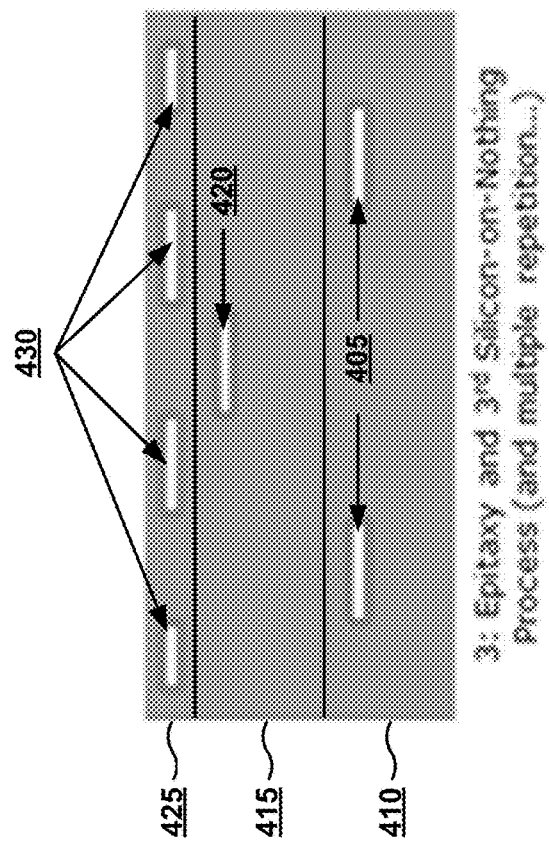
FIG. 4C

FORMING A MICROELECTROMECHANICAL SYSTEMS (MEMS) DEVICE USING SILICON-ON-NOTHING AND EPITAXY

BACKGROUND

A microelectromechanical system (MEMS) device may include a device, such as a transducer, a sensor, an actuator, and/or the like, produced using micro-machining techniques. A MEMS device may sense information from the environment by measuring a change in a physical state of the transducer and transferring a transduced signal to processing electronics that are connected to the MEMS device. A MEMS device may be manufactured using micro-machining fabrication techniques similar to those used for integrated circuits.

SUMMARY

In some implementations, a method for forming a MEMS device may include performing a first silicon-on-nothing process to create one or more first cavities in a monocrystalline silicon substrate. The method may include depositing an epitaxial layer on a surface of the monocrystalline silicon substrate. The method may include performing a second silicon-on-nothing process to create one or more second cavities in the epitaxial layer. The method may include exposing the one or more first cavities and the one or more second cavities by removing a portion of the monocrystalline silicon substrate and the epitaxial layer.

In some implementations, a method for forming a MEMS device may include performing a first silicon-on-nothing process to form a first cavity in a substrate. The method may include depositing an epitaxial layer on a surface of the substrate. The method may include performing a second silicon-on-nothing process to form a second cavity in the epitaxial layer. The method may include exposing the first cavity and the second cavity by removing a portion of the substrate and the epitaxial layer.

In some implementations, a method for forming a MEMS device may include performing a silicon-on-nothing process to form one or more first cavities in a monocrystalline silicon substrate. A first cavity, of the one or more first cavities, may be positioned at a first depth from a backside surface of the monocrystalline silicon substrate. The method may include iteratively depositing one or more epitaxial layers and performing one or more corresponding silicon-on-nothing processes to form one or more second cavities in the one or more epitaxial layers. A second cavity, of the one or more second cavities, may be positioned at a second depth from a backside surface of the monocrystalline silicon substrate, and the second depth may be different from the first depth. The method may include exposing the one or more first cavities and the one or more second cavities.

In some implementations, a MEMS device may include a monocrystalline semiconductor substrate that includes a MEMS structure. The MEMS structure may include a first structure on a first level of the monocrystalline semiconductor substrate and a second structure on a second level of the monocrystalline semiconductor substrate. The first level may be located at a first depth into the substrate that is different from a second depth of the second level. Monocrystalline semiconductor material, between the first level and the second level, may be free of material other than semiconductor material.

BRIEF DESCRIPTION OF THE DRAWINGS

FIGS. 4A-4E are diagrams of an example of forming a MEMS device using silicon-on-nothing and epitaxy.

DETAILED DESCRIPTION

The following detailed description of example implementations refers to the accompanying drawings. The same reference numbers in different drawings may identify the same or similar elements.

Fabrication of silicon MEMS devices involves integrated circuit fabrication processes and micro-machining processes, including the selective removal of silicon and/or the addition of other structural layers. It is desirable for fabricated MEMS devices to fulfill several objectives, such as mechanical stability over large structural areas, electrical coupling of comb-drives of the MEMS device (e.g., in the case of a MEMS microphone or another device that uses comb-drives), dielectric isolation, and/or the like. For a surface micro-machined MEMS device with comb-drives, a high aspect ratio of the comb-drives (e.g., a ratio of inter-finger comb spacing to height of the combs) may be desirable, but may be difficult to achieve when considering competing objectives regarding the thickness of the active layer. For example, it may be difficult to create a structure with equal thicknesses for the comb-fingers and the large surface layer, such as a membrane layer used for a MEMS microphone.

For a MEMS microphone or another type of MEMS device, a stiff supporting framework may be needed to provide a rigid and lightweight surface layer, such as a membrane layer, and a comb-drive of the MEMS device may need a specific configuration (e.g., a particular distance between comb-fingers, a particular length of comb-fingers, etc.). For example, it may be difficult to form a high aspect ratio comb-drive. In some cases, fabrication of a MEMS device that includes a comb-drive and a supporting layer (e.g., a membrane layer, an anchor, a stator, and/or the like) may use different types of material for the comb-drive and the supporting layer(s). However, this may lead to unwanted bending and poorly-balanced stress in different layers due to different relaxation behavior of buried structures during thermal treatment.

Implementations described herein permit the use of monocrystalline silicon as a material for both the comb structure and the supporting layer of a MEMS device, such as the comb-drive and membrane layer of a MEMS microphone. In this way, a framework and the comb structures supported by the framework may be made of a stress-free silicon substrate, thereby reducing bending and balancing stress more uniformly in different layers of the MEMS device. Furthermore, implementations described herein permit easy adjustment to the height and other geometries of fabricated structures.

Figure 1:
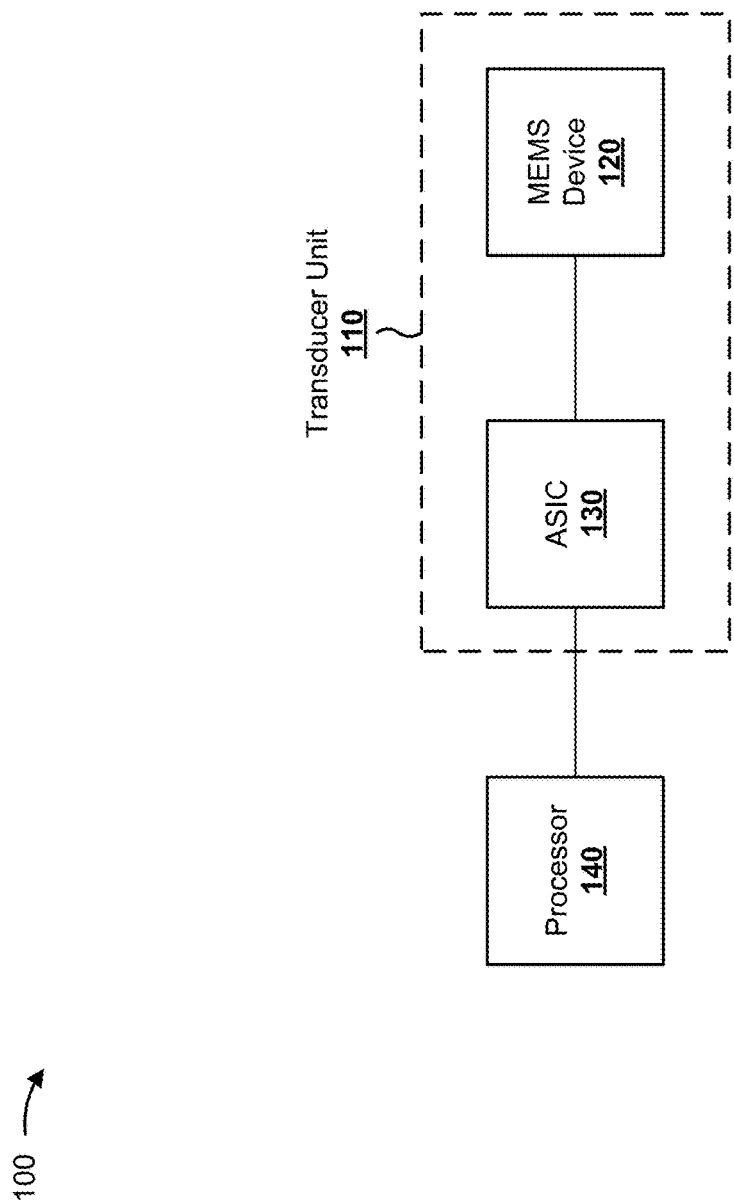
FIG. 1 is a diagram of an example system in which a MEMS device may operate.

FIG. 1 is a diagram of an example system 100 in which a MEMS device may operate. As shown in FIG. 1, system 100 may include a transducer unit 110, which may include a MEMS device 120 and an application-specific integrated circuit (ASIC) 130. As further shown, system 100 may include a processor 140. Components of system 100 may interact via wired connections, wireless connections, or some combination thereof.

Transducer unit 110 may include MEMS device 120 and ASIC 130. In some implementations, transducer unit 110 may be a packaged device, such as a packaged microphone, including a package opening, such as a sound port, for receiving a physical signal (e.g., by MEMS device 120). Additionally, or alternatively, transducer unit 110 may include a shared circuit board with separate semiconductor dies, for MEMS device 120 and ASIC 130, attached to the shared circuit board. In some implementations, MEMS device 120 and ASIC 130 may be assembled in a chip stack as a system-on-chip (SoC), such as through flip-chip bonding. In some implementations, MEMS device 120 and ASIC 130 may be integrated on a single semiconductor die (e.g., monolithically integrated) as an SoC.

MEMS device 120 may receive a physical signal, may generate a transduced signal based on the physical signal, and may provide the transduced signal to ASIC 130. For example, MEMS device 120 may provide an analog electrical signal, representative of the physical signal sensed by MEMS device 120, to ASIC 130. The analog electrical signal may include, for example, a single signal (e.g., a single-ended signal), a differential signal, or the like. In some implementations, MEMS device 120 may include a MEMS microphone, and the physical signal may include a pressure signal, such as an acoustic pressure wave. Additionally, or alternatively, MEMS device 120 may include a MEMS accelerometer, a MEMS gyroscope, a MEMS mirror structure, a MEMS Light Detection and Ranging (LIDAR) device, a MEMS sensor, a MEMS transducer, and/or the like.

ASIC 130 may generate an output signal based on the analog electrical signal from MEMS device 120, and may provide the output signal to processor 140. Additionally, or alternatively, ASIC 130 may perform other functions, such as providing a bias signal to MEMS device 120, supplying a constant charge and/or a constant voltage to MEMS device 120, implementing a buffer circuit, implementing an amplifier circuit for a signal from MEMS device 120, and/or the like. In some implementations, ASIC 130 may include an analog-to-digital converter (ADC), and may provide a digital signal, corresponding to an analog electrical signal received from MEMS device 120, to processor 140. Additionally, or alternatively, ASIC 130 may include an input/output circuit and/or a communication interface for communicating with processor 140.

Processor 140 is implemented in hardware, firmware, or a combination of hardware and software. Processor 140 may include a central processing unit (CPU), a graphics processing unit (GPU), an accelerated processing unit (APU), a microprocessor, a microcontroller, a digital signal processor (DSP), a field-programmable gate array (FPGA), an ASIC, or another type of processing component. In some implementations, processor 140 includes one or more processors capable of being programmed to perform a function. Processor 140 may receive a signal (e.g., an analog signal, a digital signal, and/or the like) from ASIC 130, and may perform processing based on the signal. In some implementations, such as when MEMS device 120 is a MEMS microphone, processor 140 may be a dedicated audio processor, such as an audio coder/decoder (CODEC). In some implementations, processor 140 may include or be connected to a memory device.

The number and arrangement of components shown in FIG. 1 are provided as an example. In practice, there can be additional components, fewer components, different components, or differently arranged components than those shown in FIG. 1. Furthermore, two or more components shown in FIG. 1 can be implemented within a single component, or a single component shown in FIG. 1 can be implemented as multiple, distributed components. Additionally, or alternatively, a set of components (e.g., one or more devices) of system 100 may perform one or more functions described as being performed by another set of components of system 100.

Figure 2:
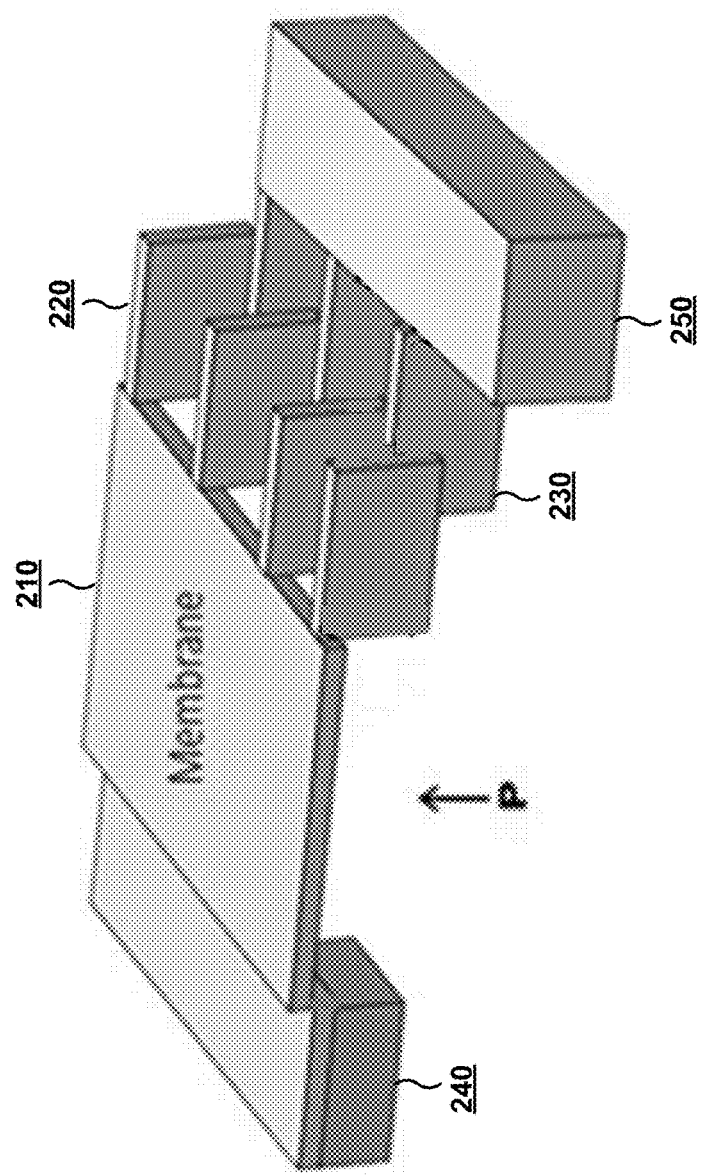
FIG. 2 is a diagram of an example MEMS device.

FIG. 2 is a diagram of an example MEMS device 200. In some implementations, MEMS device 200 corresponds to MEMS device 120 of FIG. 1. As shown in FIG. 2, MEMS device 200 may include a membrane 210, rotor comb-fingers 220, stator comb-fingers 230, an anchor 240, and a stator 250. In some implementations, MEMS device 200 is MEMS microphone that includes a comb-drive transducer, such a pressure transducer (e.g., an acoustic pressure wave transducer). In some implementations, MEMS device 200 may include another type of transducer using a comb-drive mechanism, such as an accelerometer, a gyroscope, a mirror structure, a LIDAR device, and/or the like. An implementation in which MEMS device 200 is a pressure transducer is described below.

In some implementations, membrane 210 divides a first volume above membrane 210 from a second volume below membrane 210. As shown, pressure P, such as an acoustic pressure wave, may act on membrane 210 (e.g., from below, from above, etc.). In FIG. 2, pressure P is shown as acting from below membrane 210, which may correspond to a sound port or an opening in a package arranged to provide fluid communication with the bottom of membrane 210 (the second volume). As pressure P varies, membrane 210 deflects or oscillates, which produces a change in capacitance between rotor comb-fingers 220 and stator comb-fingers 230 because of the corresponding change in an overlapping area of the comb-fingers. Thus, an electrical signal may be generated that corresponds to variations in pressure P. For example, when pressure P represents a sound wave, an electrical signal may be produced between rotor comb-fingers 220 and stator comb-fingers 230 that represents the sound wave. In this case, rotor comb-fingers 220 and stator comb-fingers 230 may be biased with a bias voltage and coupled to a read out circuit (e.g., using ASIC 130, described above in connection with FIG. 1).

As shown, rotor comb-fingers 220 may be attached to membrane 210, which may be attached to anchor 240 (e.g., an anchor for membrane 210 and/or rotor comb-fingers 220). Further, stator comb-fingers 230 may be attached to stator 250, which may also be referred to as an anchor for stator comb-fingers 230. Anchor 240 and stator 250 may be fixed to a substrate or another rigid support structure in order to prevent movement, while membrane 210 may be formed in order to be thin and deflectable.

In some implementations, two or more structures shown in FIG. 2 (e.g., membrane 210, rotor comb-fingers 220, stator comb-fingers 230, anchor 240, and/or stator 250) may be formed of a same conductive or semiconductive layer, such as a monocrystalline silicon substrate, as described in more detail elsewhere herein. In some implementations, the monocrystalline silicon substrate is not a silicon-on-insulator (SOI) substrate or wafer (e.g., is a non-SOI substrate or wafer). By forming multiple structures using the same material, bending may be reduced or equalized throughout the structure, and stress may be balanced uniformly across different structures of MEMS device 200, thereby improving performance of MEMS device 200. Further, geometries of different structures (e.g., a height of a structure, a width of a structure, a length of a structure, a spacing between structures, and/or the like) may be easily adjusted using the techniques described in more detail elsewhere herein, and may be formed with dimensions of a few hundred nanometers or less. Further, by using a non-SOI wafer, a cost of forming the MEMS device 200 may be reduced (e.g., by using a single silicon block of standard silicon wafer material).

The number and arrangement of structures shown in FIG. 2 are provided as an example. In practice, there can be additional structures, fewer structures, different structures, or differently arranged structures than those shown in FIG. 2.

Figure 3:
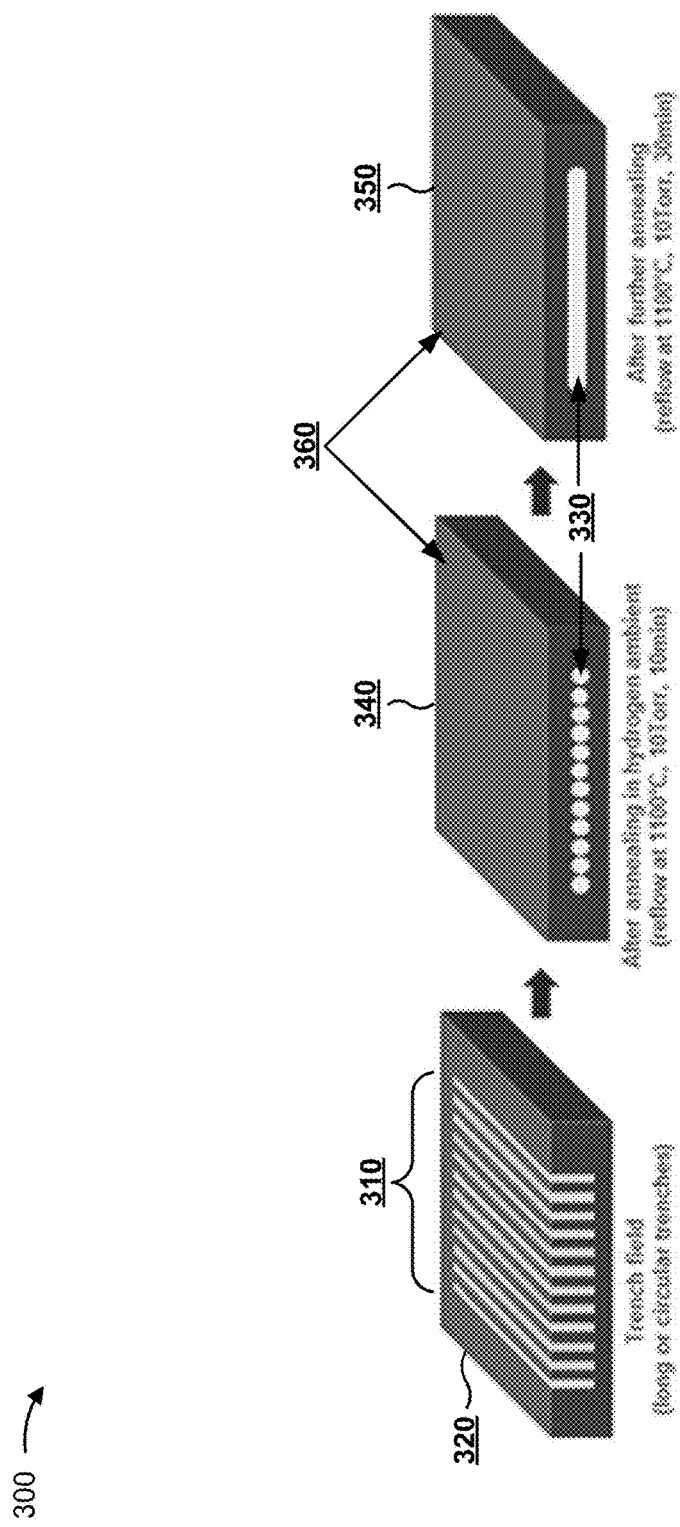
FIG. 3 is a diagram of an example silicon-on-nothing technique.

FIG. 3 is a diagram of an example silicon-on-nothing technique 300. As shown in FIG. 3, one or more trenches 310 may be etched in a substrate 320, such as a monocrystalline silicon substrate (e.g., which may be a non-SOI substrate or wafer, as described above), and the substrate 320 may undergo an annealing process to reflow the silicon to form one or more cavities 330. The trenches 310 may be etched in substrate 320 according to a pattern that matches a desired shape of the cavities 330. After the trenches 310 are etched in the substrate 320, an annealing process may be performed to reflow the silicon of substrate 320. For example, the annealing process may be performed in a low oxygen environment, such as a hydrogen environment, at a high temperature.

In some implementations, the annealing process may be performed at approximately 1100° C. at approximately 10 Torr of pressure for approximately 10 minutes. In this case, one or more cavities 330 may be formed to be substantially tubular, as shown by reference number 340. During the annealing process, the silicon columns or pillars between the trenches 310 will reflow, with the base of each trench 310 expanding and the top of each trench 310 collapsing. When the trenches 310 are spaced close together (e.g., within a threshold distance), the expanding bases of the trenches 310 will merge to form cavity or cavities 330 and the collapsing tops of the trenches 310 will also merge to form a silicon-on-nothing layer 360. Silicon-on-nothing layer 360 may be monocrystalline silicon.

In some implementations, the annealing process may be performed at approximately 1100° C. at approximately 10 Torr of pressure for approximately 30 minutes. In this case, a cavity 330 may be formed to be substantially flat, as shown by reference number 350. In some implementations, the spacing of the trenches 310 formed in substrate 320, the pressure, the temperature, the timing, the gas composition, and/or the like, used during the annealing process may be adjusted to form different shapes for cavity or cavities 330 with different thicknesses and/or dimensions.

In some implementations, a layer of material, such as an oxide liner, may be formed in cavity 330 (e.g., on the surfaces of cavity 330), and may act as an etch stop during an etching process, as described in more detail elsewhere herein. The layer of material may be a different material than the substrate 320 so as to act as an etch stop when etching substrate 320. For example, when the substrate 320 is monocrystalline silicon, the layer of material may be silicon oxide, silicon dioxide, and/or the like. In order to form the layer of material in cavity 330, an opening may be formed in silicon-on-nothing layer 360, and the material may be inserted in the cavity 330 through the opening. For example, silicon-on-nothing layer 360 may have a corner removed or a small hole formed to expose cavity 330 to an oxidizing process, such as a thermal oxidation process. In some implementations, the silicon-on-nothing technique may include a Venezia process for semiconductor material.

As indicated above, FIG. 3 is provided merely as an example. Other examples are possible and may differ from what was described with regard to FIG. 3.

FIGS. 4A-4E are diagrams of an example 400 of forming a MEMS device (e.g., MEMS device 120, MEMS device 200, and/or the like) using silicon-on-nothing and epitaxy.

As shown in FIG. 4A, a first silicon-on-nothing process may be performed to create one or more first cavities 405 in a monocrystalline silicon substrate 410. In some implementations, the monocrystalline silicon substrate 410 is a non-SOI substrate or wafer, thereby reducing a cost of forming the MEMS device. Although FIG. 4A shows two cavities 405, a different number of cavities 405 may be formed in the monocrystalline silicon substrate 410.

As shown in FIG. 4B, a first epitaxial layer 415 may be deposited on a surface of the monocrystalline silicon substrate 410, and a second silicon-on-nothing process may be performed to create one or more second cavities 420 in the first epitaxial layer 415. As shown, the one or more second cavities 420 and the one or more first cavities 405 may be located at different depths from a surface (e.g., a backside, a frontside, etc.) of the monocrystalline silicon substrate 410. Although FIG. 4B shows one cavity 420, a different number of cavities 420 may be formed in the first epitaxial layer 415.

As shown in FIG. 4C, a second epitaxial layer 425 may be deposited on a surface of the first epitaxial layer 415, and a third silicon-on-nothing process may be performed to create one or more third cavities 430 in the second epitaxial layer 425. As shown, the one or more third cavities 430, the one or more second cavities 420, and the one or more first cavities 405 may be located at different depths from a surface (e.g., a backside, a frontside, etc.) of the monocrystalline silicon substrate 410. Although FIG. 4C shows four cavities 430, a different number of cavities 430 may be formed in the second epitaxial layer 425.

Figure 4E:
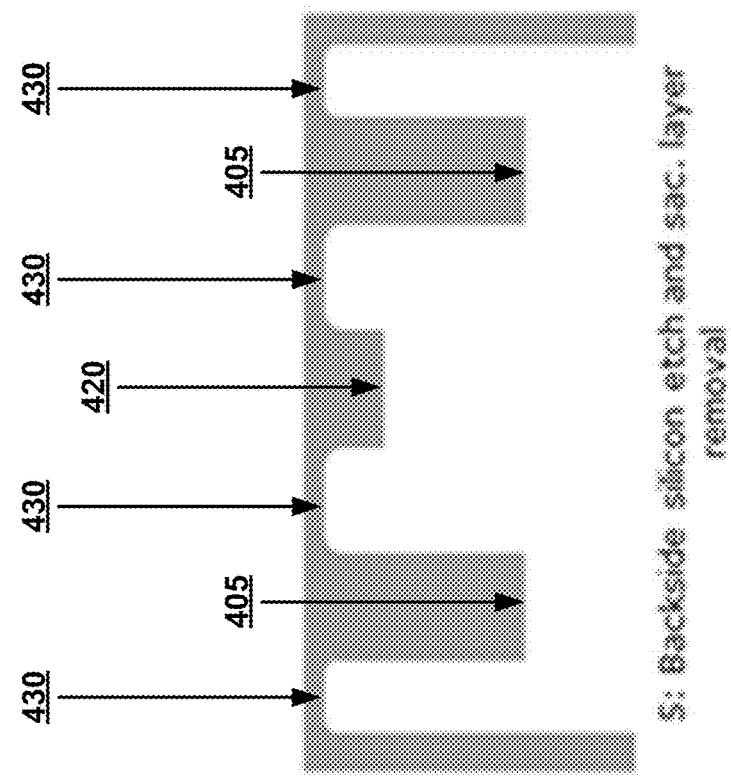
Figure 4D:
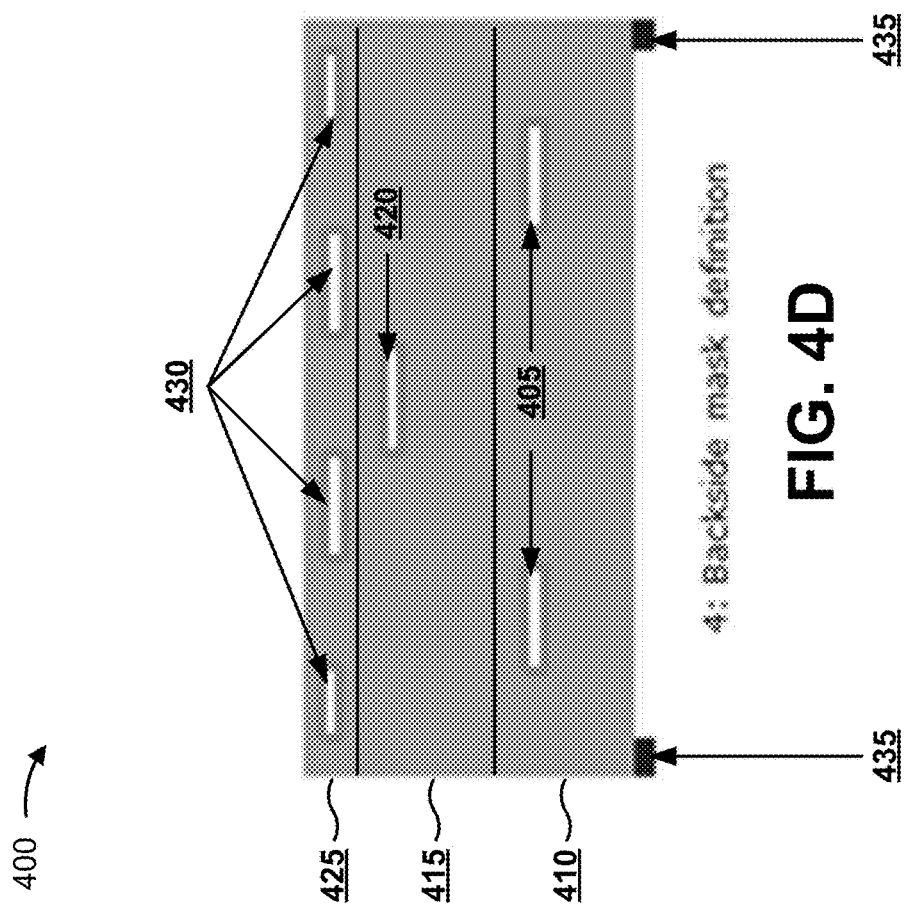

As shown in FIGS. 4D and 4E, the first cavities 405, the second cavity 420, and/or the third cavities 430 may be exposed by removing a portion of the monocrystalline silicon substrate 410, the first epitaxial layer 415, and/or the second epitaxial layer 425. As shown, in some implementations, the cavities 405, 420, 430 may be exposed by performing a backside etch through the monocrystalline silicon substrate 410 and the epitaxial layers 415, 425. In this case, a backside mask 435 may be defined on a backside of the monocrystalline silicon substrate 410, and the backside etch may be performed to expose the cavities 405, 420, 430 while preserving material above the backside mask 435.

Additionally, or alternatively, the cavities 405, 420, 430 may be exposed by performing a frontside etch through one or more epitaxial layers 415, 425, and/or the monocrystalline silicon substrate 410. In this case, a frontside mask may be defined on a frontside of the monocrystalline silicon substrate 410, and the frontside etch may be performed to expose the cavities 405, 420, 430 while preserving material below the frontside mask. In some implementations, a first set of cavities (e.g., one or more cavities) may be exposed by performing a frontside etch (e.g., through one or more epitaxial layer and/or the substrate), and a second set of cavities may be exposed by performing a backside etch (e.g., through the substrate and/or one or more epitaxial layers). In this way, the silicon-on-nothing process with epitaxy described herein may be used flexibly to create a wide variety of structures with different geometries. For example, the silicon-on-nothing process with epitaxy described herein may be used to form a MEMS device that includes a membrane layer and a comb structure formed by exposing multiple cavities, such as a MEMS microphone. Additionally, or alternatively, the silicon-on-nothing process with epitaxy described herein may be used to form a MEMS accelerometer, a MEMS gyroscope, a MEMS mirror structure, a MEMS LIDAR device, and/or the like.

In some implementations, prior to depositing an epitaxial layer, a layer of material, such as an oxide liner, may be deposited on a surface of one or more cavities on a top layer (e.g., the substrate or an epitaxial layer). This process may be repeated for cavities on additional layers so that the cavities throughout substrate and the epitaxial layer(s) act as etch stops during an etching process. The layer of material deposited in the cavities may be different from a material of the substrate and the epitaxial layers. For example, the substrate and the epitaxial layers may be monocrystalline silicon, and the layer of material deposited in the cavities may be silicon oxide, silicon dioxide, and/or the like.

In some implementations, a complementary metal-oxide-semiconductor (CMOS) process may be performed to create an integrated circuit that includes the MEMS device formed using silicon-on-nothing with epitaxy. For example, the CMOS process may be performed prior to defining an etch mask and/or exposing one or more cavities. The CMOS process may be performed to introduce circuitry to the MEMS device. Additionally, or alternatively, a doping process may be performed to alter one or more properties of the monocrystalline silicon substrate and/or the epitaxial layer(s). For example, the doping process may be performed prior to defining an etch mask and/or exposing one or more cavities.

As shown in FIGS. 4A-4E, in some implementations, one or more cavities may be substantially flat (e.g., as described above in connection with reference number 350 of FIG. 3). Additionally, or alternatively, one or more cavities may be substantially tubular (e.g., as described above in connection with reference number 340 of FIG. 3). In some implementations, different cavities may be formed with different shapes (e.g., substantially flat, substantially tubular, or having some other shape), different sizes, and/or the like. For example, different cavities in the same layer (e.g., the substrate, an epitaxial layer, etc.) may be formed with different shapes, different sizes, and/or the like. Additionally, or alternatively, different cavities in different layers may be formed with different shapes, different sizes, and/or the like.

The silicon-on-nothing with epitaxy technique described herein may be used to create a monocrystalline semiconductor substrate that includes a MEMS structure. The MEMS structure may include a first structure on a first level of the monocrystalline semiconductor substrate and a second structure on a second level of the monocrystalline semiconductor substrate. In some implementations, the first structure may be formed from a first cavity that acts as an etch stop to form the first structure, and the second structure may be formed from a second cavity that acts as an etch stop to form the second structure. The first level may be located at a first depth into the substrate that is different from a second depth of the second level. In some implementations, monocrystalline semiconductor material may be present between the first level and the second level. The monocrystalline substrate may be free of material other than semiconductor material. For example, the monocrystalline substrate may be free of SOI material (e.g., may be non-SOI material).

By iteratively depositing one or more epitaxial layers on a monocrystalline silicon substrate and performing one or more corresponding silicon-on-nothing processes to form cavities at different depths in a structure formed by the monocrystalline silicon substrate and the one or more epitaxial layers, the cavities may be exposed to create various structures with various geometries. A structure formed according to this silicon-on-nothing with epitaxy technique may be less susceptible to bending and may distribute stress more uniformly throughout the structure, as compared to a structure formed using different materials for different layers, because the entire structure may be formed from a same material (e.g., multiple layers, such as a substrate and/or epitaxial layers, may be formed from monocrystalline silicon). Further, by using a non-SOI wafer rather than an SOI wafer, such a structure may be formed at less cost.

As indicated above, FIGS. 4A-4E are provided merely as an example. Other examples are possible and may differ from what was described with regard to FIGS. 4A-4E.

Figure 5:
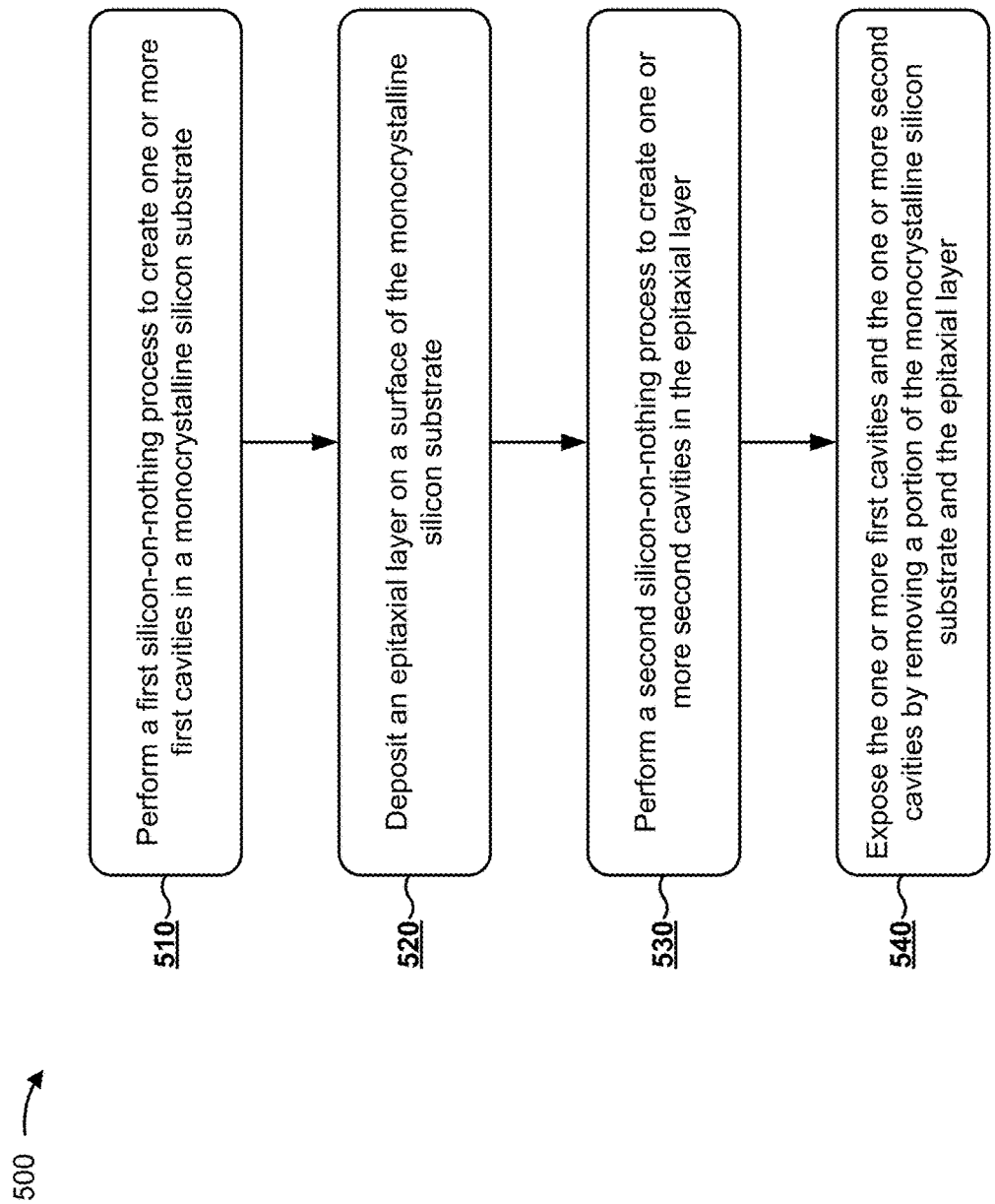
FIGS. 5-7 are flow charts of example processes for forming a MEMS device using silicon-on-nothing and epitaxy.

FIG. 5 is a flow chart of an example process 500 for forming a MEMS device using silicon-on-nothing and epitaxy. In some implementations, process 500 may be used to form MEMS device 120, MEMS device 200, and/or the like.

As shown in FIG. 5, process 500 may include performing a first silicon-on-nothing process to create one or more first cavities in a monocrystalline silicon substrate (block 510). For example, during MEMS device formation, a first silicon-on-nothing process may be performed to create one or more first cavities in a monocrystalline silicon substrate, as described above in connection with FIGS. 4A-4E. In some implementations, the monocrystalline silicon substrate is a non-silicon-on-insulator (non-SOI) substrate and/or wafer. In some implementations, at least one cavity, of the one or more first cavities, is substantially tubular or substantially flat.

As further shown in FIG. 5, process 500 may include depositing an epitaxial layer on a surface of the monocrystalline silicon substrate (block 520). For example, during MEMS device formation, an epitaxial layer may be deposited on a surface of the monocrystalline silicon substrate, as described above in connection with FIGS. 4A-4E.

As further shown in FIG. 5, process 500 may include performing a second silicon-on-nothing process to create one or more second cavities in the epitaxial layer (block 530). For example, during MEMS device formation, a second silicon-on-nothing process may be performed to create one or more second cavities in the epitaxial layer, as described above in connection with FIGS. 4A-4E. In some implementations, the one or more first cavities and the one or more second cavities are formed and/or located at different depths in the monocrystalline silicon substrate. For example, the one or more first cavities and the one or more second cavities may be formed and/or located at different depths from a backside of the monocrystalline silicon substrate. In some implementations, at least one cavity, of the one or more second cavities, is substantially tubular or substantially flat.

In some implementations, one or more additional epitaxial layers may be deposited (e.g., on a surface of the deposited epitaxial layer), and one or more additional silicon-on-nothing processes may be performed to create one or more third cavities in the one or more additional epitaxial layers.

As further shown in FIG. 5, process 500 may include exposing the one or more first cavities and the one or more second cavities by removing a portion of the monocrystalline silicon substrate and the epitaxial layer (block 540). For example, during MEMS device formation, one or more first cavities and the one or more second cavities may be exposed by removing a portion of the monocrystalline silicon substrate and the epitaxial layer, as described above in connection with FIGS. 4A-4E. In some implementations, one or more third cavities in one or more additional epitaxial layers may be exposed.

In some implementations, the one or more first cavities and the one or more second cavities may be exposed by forming corresponding layers of material, different from a material of the substrate, at least partially on corresponding surfaces of the one or more first cavities and the one or more second cavities, and performing at least one of a backside etch or a frontside etch through the monocrystalline silicon substrate and the epitaxial layer, where the corresponding layers of material act as etch stops.

In some implementations, a CMOS process may be performed to create an integrated circuit that includes the MEMS device (e.g., prior to exposing the one or more first cavities and/or the one or more second cavities). Additionally, or alternatively, a doping process may be performed (e.g., on the monocrystalline silicon substrate and/or one or more epitaxial layers) prior to exposing the one or more first cavities and/or the one or more second cavities.

In some implementations, the MEMS device formed using process 500 may include at least one of: a microphone, an accelerometer, a gyroscope, a mirror structure, a LIDAR device, or some combination thereof. Additionally, or alternatively, the MEMS device formed using process 500 may include a membrane layer and a comb structure formed by exposing the one or more first cavities and the one or more second cavities.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
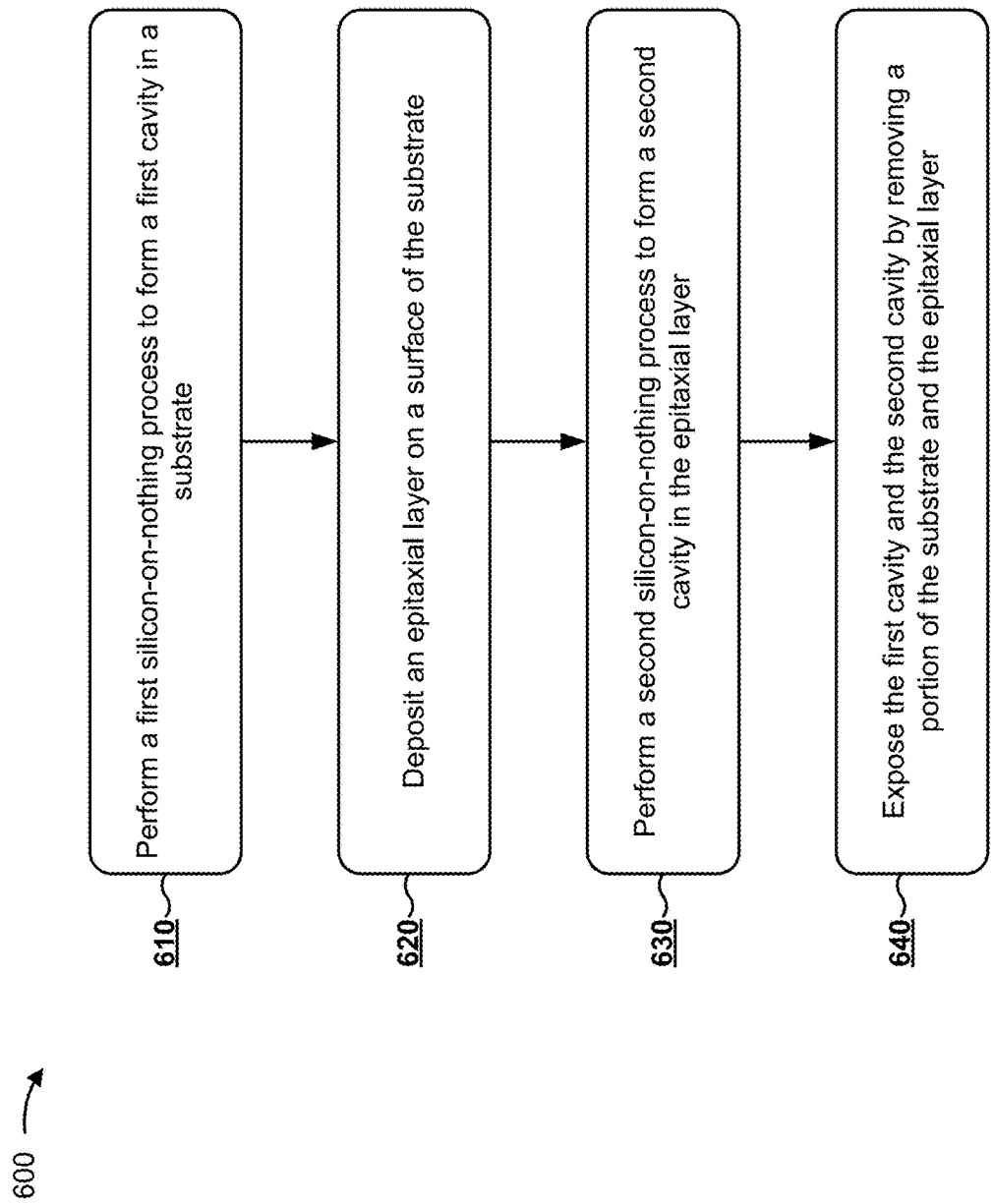

FIG. 6 is a flow chart of an example process 600 for forming a MEMS device using silicon-on-nothing and epitaxy. In some implementations, process 600 may be used to form MEMS device 120, MEMS device 200, and/or the like.

As shown in FIG. 6, process 600 may include performing a first silicon-on-nothing process to form a first cavity in a substrate (block 610). For example, during MEMS device formation, a first silicon-on-nothing process may be performed to form a first cavity in a substrate, as described above in connection with FIGS. 4A-4E. In some implementations, the substrate is a monocrystalline silicon substrate. Additionally, or alternatively, the substrate may be a non-SOI substrate.

As further shown in FIG. 6, process 600 may include depositing an epitaxial layer on a surface of the substrate (block 620). For example, during MEMS device formation, an epitaxial layer may be deposited on a surface of the substrate, as described above in connection with FIGS. 4A-4E.

As further shown in FIG. 6, process 600 may include performing a second silicon-on-nothing process to form a second cavity in the epitaxial layer (block 630). For example, during MEMS device formation, a second silicon-on-nothing process may be performed to form a second cavity in the epitaxial layer, as described above in connection with FIGS. 4A-4E. In some implementations, the first cavity and the second cavity are located at different depths in a structure formed by the substrate and the epitaxial layer.

In some implementations, at least one of the first cavity or the second cavity is substantially tubular or substantially flat.

In some implementations, one or more epitaxial layers may be iteratively deposited, and one or more corresponding silicon-on-nothing processes may be performed to form cavities. The cavities may be exposed (e.g., in connection with block 640, below).

As further shown in FIG. 6, process 600 may include exposing the first cavity and the second cavity by removing a portion of the substrate and the epitaxial layer (block 640). For example, during MEMS device formation, the first cavity and the second cavity may be exposed by removing a portion of the substrate and the epitaxial layer, as described above in connection with FIGS. 4A-4E. In some implementations, a CMOS process and/or a doping process is performed prior to exposing the first cavity and/or the second cavity. In some implementations, a CMOS process and/or a doping process is performed after exposing the first cavity and/or the second cavity.

In some implementations, exposing the first cavity and the second cavity includes forming a first layer, different from a material of the substrate, at least partially on a surface of the first cavity; forming a second layer, different from a material of the substrate, at least partially on a surface of the second cavity; and performing at least one of a backside etch or a frontside etch through the monocrystalline silicon substrate and the epitaxial layer, where the first layer and the second layer act as etch stops.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
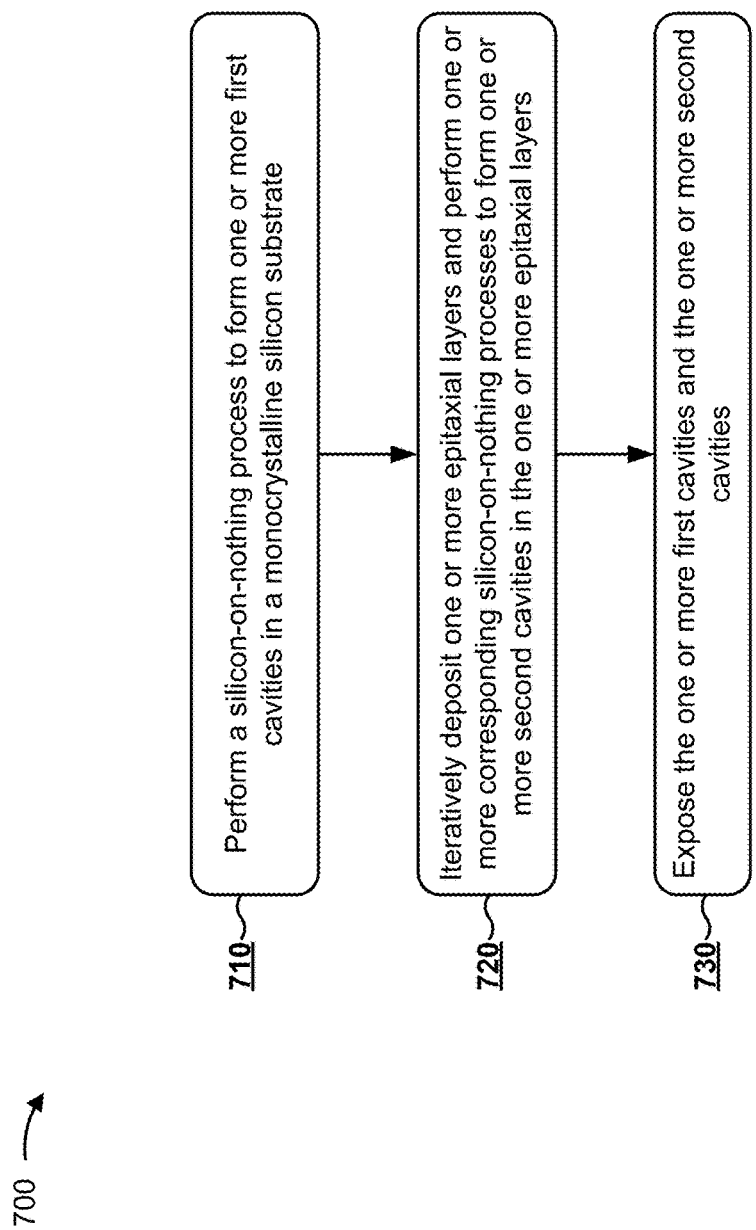

FIG. 7 is a flow chart of an example process 700 for forming a MEMS device using silicon-on-nothing and epitaxy. In some implementations, process 700 may be used to form MEMS device 120, MEMS device 200, and/or the like.

As shown in FIG. 7, process 700 may include performing a silicon-on-nothing process to form one or more first cavities in a monocrystalline silicon substrate (block 710). For example, during MEMS device formation, a silicon-on-nothing process may be performed to form one or more first cavities in a monocrystalline silicon substrate, as described above in connection with FIGS. 4A-4E. In some implementations, a first cavity, of the one or more first cavities, is positioned at a first depth from a backside surface of the monocrystalline silicon substrate.

As further shown in FIG. 7, process 700 may include iteratively depositing one or more epitaxial layers and performing one or more corresponding silicon-on-nothing processes to form one or more second cavities in the one or more epitaxial layers (block 720). For example, during MEMS device formation, one or more epitaxial layers may be iteratively deposited, and one or more corresponding silicon-on-nothing processes may be performed to form one or more second cavities in the one or more epitaxial layers, as described above in connection with FIGS. 4A-4E. In some implementations, a second cavity, of the one or more second cavities, is positioned at a second depth from a backside surface of the monocrystalline silicon substrate. In some implementations, the second depth is different from the first depth.

As further shown in FIG. 7, process 700 may include exposing the one or more first cavities and the one or more second cavities (block 730). For example, during MEMS device formation, the one or more first cavities and the one or more second cavities may be exposed, as described above in connection with FIGS. 4A-4E.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Techniques described herein may use silicon-on-nothing with epitaxy to form structures, such as MEMS devices, that are less susceptible to bending and that distribute stress more uniformly throughout the structure, as compared to a structure formed using different materials for different layers, because the structure used in these techniques may be formed from a same material (e.g., multiple layers, such as a substrate and/or epitaxial layers, may be formed from monocrystalline silicon). Further, structures with a variety of geometries may be easily created using these techniques. Further, these techniques permit the use of a non-SOI wafer rather than an SOI wafer, which reduces the cost of forming such structures.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method for forming a microelectromechanical systems (MEMS) device, the method comprising:
   performing, by a device, a first silicon-on-nothing process to create one or more first cavities in a monocrystalline silicon substrate,
   the first silicon-on-nothing process comprising:
   performing an annealing process to reflow material of the monocrystalline silicon substrate, and
   the one or more first cavities being defined by one or more internal surfaces of the monocrystalline silicon substrate;
   depositing, by the device, an epitaxial layer on a surface of the monocrystalline silicon substrate;
   performing, by the device, a second silicon-on-nothing process to create one or more second cavities in the epitaxial layer,
   the one or more second cavities being defined by one or more internal surfaces of the epitaxial layer; and
   exposing, by the device, the one or more first cavities and the one or more second cavities by:
   forming a layer of material, different from a the material of the monocrystalline silicon substrate, at least partially on the one or more internal surfaces of the monocrystalline silicon substrate and the one or more internal surfaces of the epitaxial layer; and
   performing a backside etch through the monocrystalline silicon substrate and the epitaxial layer to form a comb structure, the layer of material acting as etch stops.

2. The method of claim 1, where the one or more first cavities and the one or more second cavities are located at different depths from a backside of the monocrystalline silicon substrate.

3. The method of claim 1, further comprising:
   depositing one or more additional epitaxial layers;
   performing one or more additional silicon-on-nothing processes to create one or more third cavities in the one or more additional epitaxial layers; and
   where exposing the one or more first cavities and the one or more second cavities further comprises:
   exposing the one or more third cavities.

4. The method of claim 1, where the monocrystalline silicon substrate is a non-silicon-on-insulator (non-SOI) wafer.

5. The method of claim 1, where at least one cavity, of the one or more first cavities and the one or more second cavities, is substantially tubular or substantially flat.

6. The method of claim 1, further comprising:
   performing a complementary metal-oxide-semiconductor (CMOS) process to create an integrated circuit that includes the MEMS device.

7. The method of claim 1, further comprising:
   performing a doping process prior to exposing the one or more first cavities and the one or more second cavities.

8. The method of claim 1, where the MEMS device is at least one of:
   a microphone,
   an accelerometer,
   a gyroscope,
   a mirror structure, or
   a Light Detection and Ranging (LIDAR) device.

9. The method of claim 1, where the MEMS device includes a membrane layer formed by exposing the one or more first cavities and the one or more second cavities.

10. A method for forming a microelectromechanical systems (MEMS) device, the method comprising:
    performing, by a device, a first silicon-on-nothing process to form a first cavity in a substrate,
    the first silicon-on-nothing process comprising:
    performing an annealing process to reflow material of the substrate, and
    the first cavity being defined by a first internal surface of the substrate; depositing, by the device, an epitaxial layer on a surface of the substrate;
    performing, by the device, a second silicon-on-nothing process to form a second cavity in the epitaxial layer,
    the second cavity being defined by a second internal surface of the epitaxial layer; and exposing, by the device, the first cavity and the second cavity by:
  forming a layer of material, different from a the material of the substrate, at least partially on the first internal surface and the second internal surface; and
  performing a frontside etch through the substrate and the epitaxial layer to form a comb structure, the layer of material acting as etch stops.

11. The method of claim 10, where the substrate is a monocrystalline silicon substrate.

12. The method of claim 10, where the first cavity and the second cavity are located at different depths in a structure formed by the substrate and the epitaxial layer.

13. The method of claim 10, further comprising:
  iteratively depositing one or more epitaxial layers and performing one or more corresponding silicon-on-nothing processes to form cavities; and
  exposing the cavities.

14. The method of claim 10, where the substrate is a non-silicon-on-insulator (non-SOI) substrate.

15. The method of claim 10, where at least one of the first cavity or the second cavity is substantially tubular or substantially flat.

16. The method of claim 10, further comprising:
  performing at least one of a complementary metal-oxide-semiconductor (CMOS) process or a doping process prior to exposing the first cavity and the second cavity.

17. A method, comprising:
  performing, by a device, a silicon-on-nothing process to form one or more first cavities in a monocrystalline silicon substrate,
  the silicon-on-nothing process comprising:
  performing an annealing process to reflow material of the monocrystalline silicon substrate,
  the one or more first cavities being defined by one or more internal surfaces of the monocrystalline silicon substrate, and
  a first cavity, of the one or more first cavities, being positioned at a first depth from a backside surface of the monocrystalline silicon substrate;
  iteratively depositing, by the device, one or more epitaxial layers and performing, by the device, one or more corresponding silicon-on-nothing processes to form one or more second cavities in the one or more epitaxial layers,
  the one or more second cavities being defined by one or more internal surfaces of the one or more epitaxial layers, and
  a second cavity, of the one or more second cavities, being positioned at a second depth from the backside surface of the monocrystalline silicon substrate,
  the second depth being different from the first depth; and
  exposing, by the device, the one or more first cavities and the one or more second cavities by:
  forming a layer of material, different from a the material of the monocrystalline silicon substrate, at least partially on the one or more internal surfaces of the monocrystalline silicon substrate and the one or more internal surfaces of the one or more epitaxial layers; and
  performing a backside etch through the monocrystalline silicon substrate and the one or more epitaxial layers to form a comb structure, the layer of material acting as etch stops.

18. A microelectromechanical systems (MEMS) device, comprising:
  a monocrystalline silicon substrate comprising one or more first cavities,
  the one or more first cavities being created via a first silicon-on-nothing process that comprises an annealing process to reflow material of the monocrystalline silicon substrate, and
  the one or more first cavities being defined by one or more internal surfaces of the monocrystalline silicon substrate; and
  an epitaxial layer, deposited on a surface of the monocrystalline silicon substrate, comprising one or more second cavities,
  the one or more second cavities being created via a second silicon-on-nothing process,
  the one or more second cavities being defined by one or more internal surfaces of the epitaxial layer, and
  the one or more first cavities and the one or more second cavities being exposed via:
  a layer of material, different from the material of the monocrystalline silicon substrate, being formed at least partially on the one or more internal surfaces of the monocrystalline silicon substrate and the one or more internal surfaces of the epitaxial layer, and a backside etch being performed through the monocrystalline silicon substrate and the epitaxial layer to form a comb structure, the layer of material acting as etch stops.

19. The method of claim 1, where the first silicon-on-nothing process further comprises:
  etching one or more trenches in the monocrystalline silicon substrate.

20. The method of claim 10, where the first silicon-on-nothing process further comprises:
  etching one or more trenches in the substrate.

* * * * *

UNITED STATES PATENT AND TRADEMARK OFFICE
CERTIFICATE OF CORRECTION

PATENT NO. : 10,604,405 B2
APPLICATION NO. : 15/481075
DATED : March 31, 2020
INVENTOR(S) : Thoralf Kautzsch Page 1 of 1

It is certified that error appears in the above-identified patent and that said Letters Patent is hereby corrected as shown below:

Claim 1:
Column 12, Line 10, change "forming a layer of material, different from a the material" to --forming a layer of material, different from the material--

Claim 10:
Column 13, Line 3, change ""forming a layer of material, different from a the material" to --forming a layer of material, different from the material--

Claim 17:
Column 14, Line 4, change "forming a layer of material, different from a the material" to --forming a layer of material, different from the material--

Signed and Sealed this
Seventeenth Day of November, 2020

Andrei Iancu
*Director of the United States Patent and Trademark Office*